United States Patent [19]
Jenkins

[11] Patent Number: 5,617,286
[45] Date of Patent: Apr. 1, 1997

[54] CIRCUIT BREAKER HAVING DATA RECORDING

[75] Inventor: Jeffrey A. Jenkins, Fort Collins, Colo.

[73] Assignee: Siemens Energy & Automation, Inc., Alpharetta, Ga.

[21] Appl. No.: 315,523

[22] Filed: Sep. 30, 1994

[51] Int. Cl.⁶ .................................................. H02H 3/00
[52] U.S. Cl. ............................................ 361/93; 361/115
[58] Field of Search ........................... 361/93, 94, 95, 361/96, 103, 115, 87

[56] References Cited

U.S. PATENT DOCUMENTS 4,958,252  9/1990  Murphy ........................ 361/93

Primary Examiner—Jeffrey A. Gaffin
Assistant Examiner—Stephen W. Jackson
Attorney, Agent, or Firm—Donald M. Boles

[57] ABSTRACT

This invention relates, generally, to the recording of power related characteristics of power flowing through an electronic circuit breaker. Briefly stated, an electronic circuit breaker having a micro-processor therein and at least one port or pin on the micro-processor is used to produce an output pulse with time and/or frequency of the pulse related to the power characteristic being measured. This output pulse is thereafter transmitted to a recorder which is preferably a pulse data recorder or may be a data recorde.

10 Claims, 1 Drawing Sheet

CIRCUIT BREAKER HAVING DATA RECORDING

FIELD OF THE INVENTION

This invention relates, generally, to circuit breakers and more particularly to an electronic circuit breaker which provides an output which models a power component of the load controlled therewith for transmittal to a data recorder.

BACKGROUND OF THE INVENTION

It is known that utilities and industrial customers of such utilities are increasingly interested in performing end-use load studies. These studies are typically in the form of collecting interval power data so as to monitor and control energy consumption. While this is often done at a main load center, due to the increased costs and problems associated with time of use power consumption, such monitoring is being done closer to the individual end-use loads (i.e., motors, etc.). In this fashion, industrial customers are given a financial incentive to curtail power consumption when the cost of power is high as well as being able to more carefully and cost-effectively manage their power consumption by knowing where in their plant significant amounts of energy is being used. Moreover, the measurement of power components is being demanded more and more frequently in load control equipment and particularly in Molded Case Circuit Breakers as is frequently found in use in industry. Such power components include, RMS and peak voltage, current and power, either by phase or in total while other components which are now being frequently measured are power factor related components.

Heretofore, when power monitoring is to be done, a discrete energy transducer is installed on the equipment or circuit to be monitored. This transducer generates a digital pulse output via a mechanical or solid state relay with the frequency of the pulse output being proportional to the magnitude of the measured quantity. This digital pulse output is either hard wired or communicated via a power-line-carrier system to a discrete pulse data recording device where it is time stamped.

This recorded data is periodically retrieved either manually or through a hand-held computer or sometimes automatically via a telephone line modem. Thereafter, the data is then typically loaded into a computer which analyzes the data and calculates a load profile or other magnitude-verses-time information profile. Accordingly, the general use of pulse data recorders is well known and are produced by companies such as Schlumberger and are readily known to one skilled in the art. However, these energy transducers and data recorders are generally very bulky as well as being very costly and time consuming to install and utilize. This is particularly so in that they frequently require direct wiring to the load which thereby results in down time until installation is complete.

Accordingly, it is advantageous to produce a device which incorporates time-interval data generation directly into a circuit breaker system which thereby saves money and physical space as well as minimizing down time. In this regard, specifically included within the class of circuit breakers are molded case circuit breakers which are readily known and available to those skilled in the art and may typically be, for example, be an (SB) System Breakers produced by Siemens Energy & Automation, Inc., the assignee of the present invention. These type of breakers have current interrupting capabilities while having connected therewith an electronic portion which monitors various components of the energy being consumed by a downstream load.

However, even though such measurement capabilities exist in molded case breakers separate or discrete energy transducers and data recorders are still utilized because there is no way to directly connect data recorders to such breakers. Therefore, it is an object of the present invention to produce a device for the recording of data unique to loads without the use of separate energy transducers. It is yet another object of the present invention to produce a system for data recording which does not require the shut down of equipment or additional use of an inordinate amount of new or additional equipment.

Still a further object of the present invention is to produce a device which may utilize only a pulse-data recorder or only a simple data recorder. It is yet another object of the present invention to produce a device which does not require expensive or significant modification of the circuit breaker or associated equipment in order to provide for such data recorded.

It is yet another object of the present invention to produce apparatus for providing load related information to a data recorder, comprising a molded case circuit breaker, connectable to a load and having a current interrupting portion therein and a electronic monitor therein; the said electronic monitor controlling the current interruption portion and for producing an output signal at output terminals thereat wherein the output signal is related to at least one of the current, voltage and power related characteristics of the load; the electronic monitor comprised of at least one microprocessor having at least one output pin; and further comprising a switching device having an input connected to the output pin and having a switching device output so as to form the output terminals for producing a series of output pulses wherein the output pulses are related to at least one of the current, voltage and power related characteristics of the load; and a pulse data recorder connected to the output terminals for recording at least one of the current, voltage and power related characteristics of the load wherein the pulse data recorder summs the output signal over a predetermined period of time and time stamping the summation, the pulse data recorder being remote and discrete from the molded case circuit breaker.

DESCRIPTION OF THE DRAWINGS

Reference may be now had to the accompanying drawings in which.

DETAILED DESCRIPTION OF THE PREFERRED EMBODIMENT

Figure 1:
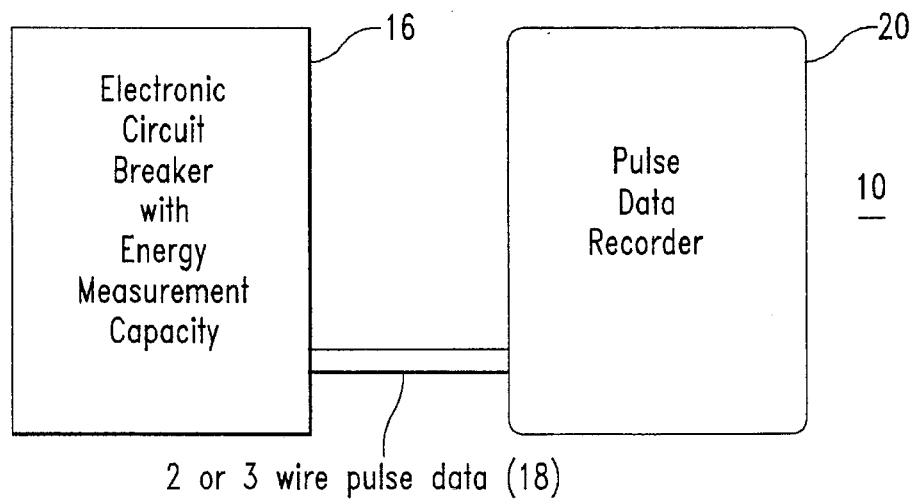
FIG. 1 A block diagram of an electronic circuit breaker interconnected with a pulse data recorder according to the present invention.

Reference may be now had to FIG. 1 which is a block diagram showing one embodiment of the present invention. More particularly, shown is an electronic circuit breaker commonly referred to as a molded case circuit break (MCCB) as is readily known and available to one skilled in the art having energy measurement capabilities. In this regard, these type of breakers may be of the type, for example produced by Siemens Energy & Automation, Inc. as part of their SB case system breaker product line. However, it is to be understood that other manufacturers or other types of breakers may be utilized without departing from the spirit and scope of the present invention.

With respect to the operation of the breaker 16 although already known and understood by those skilled in the art, a brief overview may be had with reference, by example, to U.S. Pat. No. 5,311,392 "DUAL PROCESSOR ELECTRIC POWER TRIP UNIT" which is specifically incorporated by reference herein. In this regard, the electronic circuit breaker 16 of the present invention is generally comprised of a mechanical breaker portion (such as found, for example, in U.S. Pat. No. 4,513,267 —which is also specifically incorporated by reference herein). The mechanical portion of the breaker, as is readily known is used to provide or interrupt electrical power to a load. The mechanical portion of the breaker (not shown) is controlled by an electronic portion (not shown) but is similar to that found in previously mentioned U.S. Pat. No. 5,311,392 ('392).

From this it can be seen that the electronics portion of the MCCB essentially has load measurement capabilities. Further, it is to be understood that other types of electronics may be utilized without departing from the spirit or the scope of the present invention. Such electronics, for example, may monitor or function in conjunction with the mechanical portion of the breaker by measuring whatever power components are desired or required such as, peak and/or RMS current voltage and power on a per-phase basis or over all three phases, power factor, kilowatt hours and the like. Additionally, it is to be understood that other criteria may be monitored such as harmonic distortion without departing from the spirit and scope of the present invention. Therefore, for the reasons stated, since it is readily known and available to one skilled in the art that electronic circuit breakers have inherent energy measurement capability, further description of reference numeral 16 will not be had.

Figure 3:
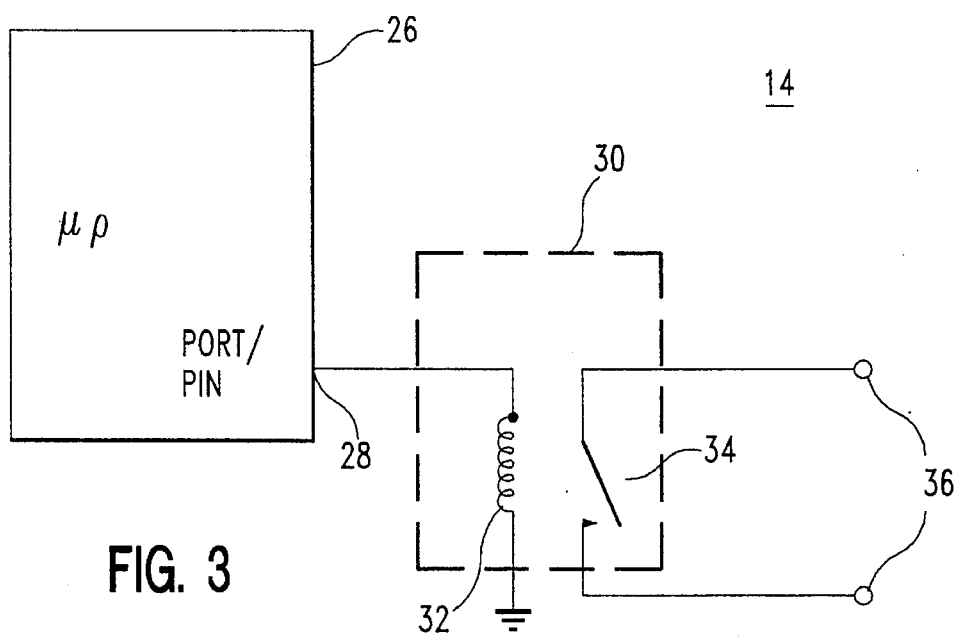
FIG. 3 A simplified schematic diagram of pulse outputs produced by the circuit breaker of the preferred embodiment of the present invention.

By referring to FIG. 3 it can be seen how this measured information would be simply and readily transmitted to a pulse data recorder 20. Here, a micro-processor 26 which is used with the energy measurement capability of electronic circuit breaker 16 has an output port or pin 28. This output port or pin may directly drive a relay 30 having a coil 32 and a set of contacts 34. In the preferred embodiment of the present invention a mercury relay is preferred as there is no contact bounce while having high current capabilities thereby allowing for a relatively long wire path 18. Further, as long as a port or pin 28 is used with respect to a micro-processor 26 it is known that the output presented to pin 28 may be representative of whatever is programmed into micro-processor 26. In this fashion, the output from micro-processor 26 at port or pin 28 may represent peak or RMS current, voltage, power and the like or any other desired measured capability and may therefore be permanently programmed or altered or programmed according to a user's or designer's needs just like any other data or address pin in a micro-processor such as 26. In this regard, the present invention does note need or require the utilization of a new micro-processor but rather simply port or pin from a micro-processor already used with respect to the electronics portion of electronic circuit breaker 16. In this way, the incremental cost to providing output data is minimal.

By pulsing port or pin 28, relay contact 34 may be opened or closed thereby providing a current path through terminals 36 which are thereafter presented to pulse data recorder 20. As previously recited, any suitable pulse data recorder may be utilized. By pulse data recorder is specifically meant commonly used and available pulse data recorders that receive a pulse, which may be summed over a specified time interval, time stamped and stored by the recording device. This is distinct from the data recorder of FIG. 2 which merely records information and may provide each piece of data with date and time stamping.

Accordingly, in the preferred embodiment of the present invention as shown in FIG. 1, the digital pulses produced by port or pin 28 are sent over wire 18 to a pulse data recorder 20. The pulse data recorder 20 receives the pulses, sums them over a specified time interval, time stamps the summation and then records same within the device. It may thereafter be retrieved for eventual analysis by another computer or manual analysis depending upon whether the data recorder provides a hard copy or merely electronic storage. In this fashion, however, due to the programmability of micro-processor 26 various data can be presented to port or pin 28 which in effect would provide a plurality of channels of information to be stored in pulse data recorder 20.

It is to be understood that the time interval data utilized by pulse data recorder 20 or data recorder 22 (as described more fully below) can be in either of two formats:

1. The measured quantity can be represented as a continuous stream of digital pulses (generated by microprocessor 26) with the frequency being proportional to the magnitude of the measured quantity; or
2. The measured quantity can be represented as a number which is the true value of the measured quantity integrated over a user-specified time interval by processor 26. In this fashion, there is great flexibility as to the presently existing recorders 20, 22 that may be utilized.

Figure 2:
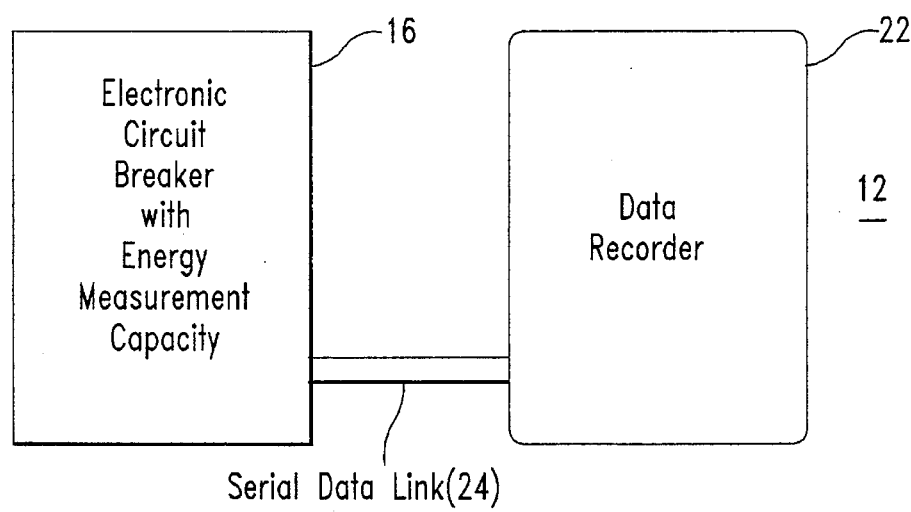
FIG. 2 A block diagram of an alternate embodiment of the present invention utilizing an electronic circuit breaker in conjunction with a simple data recorder.

Referring now to FIG. 2, an alternate embodiment of the present invention may be seen. Shown is a data recorder 22 as distinct from the pulse data recorder 20 of FIG. 1. Here, measured data is integrated by microprocessor 26 over a specified time interval and thereafter time stamped by the processor 26. This information is then sent down serial data link 24 to the recording device 26 along with this date and time information.

Accordingly, since data recorders are frequently utilized and known by those skilled in the art, the present invention provides an inexpensive and convenient mechanism to utilize information which is available at a circuit breaker. This therefore avoids additional cost, training and the like. Further, the electronic circuit breaker may supply an entire load center in which case that entire load centers power characteristics may be monitored or simply a circuit breaker dedicated to a specific or single load. In this fashion, power characteristics may be detailed as fine as the power distribution network within a particular system.

It is to be understood that many variations of the present invention may be practiced without departing from the spirit and scope of the present invention and that the present invention be limited only by the claims appended hereto.

What is claimed is:

1. Apparatus for providing load related information to a data recorder, comprising:

a circuit breaker, connectable to a load and having a current interrupting portion therein and a electronic monitoring means therein;

said electronic monitoring means controlling said current interruption portion and for producing an output signal at output terminals thereat, said output signal related to at least one of the current, voltage and power related characteristics of the load; and a data recorder connected to said output terminals for recording said at least one of the current, voltage and power related characteristics of the load and wherein said data recorder is a pulse data recorder and wherein said pulse data recorder sums said output signal over a predetermined period of time and time stamps said summation.

2. Apparatus according to claim 1 wherein said circuit breaker is comprised of a molded case circuit breaker.

3. Apparatus according to claim 1 wherein said electronic monitoring means is comprised of at least one microprocessor having at least one output pin for producing a series of output pulses, said output pulses related to at least one of the current, voltage and power related characteristics of the load.

4. Apparatus according to claim 1 wherein said pulse data recorded in said data recorder is downloadable to at least one of a handheld computer and a network containing a central computer.

5. Apparatus according to claim 1 wherein said electronic monitoring means is comprised of at least one microprocessor having at least one output pin for producing a series of output pulses, said output pulses related to at least one of the current, voltage and power related characteristics of the load.

6. Apparatus according to claim 5 wherein said data recorder is discrete and remote from said circuit breaker.

7. Apparatus according to claim 5 further comprising a switching device having an input connected to said output pin and having a switching device output so as to form said output terminals.

8. Apparatus according to claim 7 wherein said switching device is a relay.

9. Apparatus according to claim 7 wherein said switching device is a semiconductor switch.

10. Apparatus for providing load related information to a data recorder, comprising:

a molded case circuit breaker, connectable to a load and having a current interrupting portion therein and a electronic monitoring means therein;

said electronic monitoring means controlling said current interruption portion and for producing an output signal at output terminals thereat, said output signal related to at least one of the current, voltage and power related characteristics of the load; said electronic monitoring means comprised of at least one microprocessor having at least one output pin; and further comprising a switching device having an input connected to said output pin and having a switching device output so as to form said output terminals for producing a series of output pulses, said output pulses related to at least one of the current, voltage and power related characteristics of the load; and a pulse data recorder connected to said output terminals for recording said at least one of the current, voltage and power related characteristics of the load, said pulse data recorder summing said output signal over a predetermined period of time and time stamping said summation, said pulse data recorder being remote and discrete from said molded case circuit breaker.

* * * * *